United States Patent [19]

Campagnie

[11] Patent Number: 5,034,696
[45] Date of Patent: Jul. 23, 1991

[54] CIRCUIT FOR THE AUTOMATIC CONTROL OF THE OFF-LOAD VOLTAGE OF A LOAD, AND DIFFERENTIAL COMPARATOR INCLUDING THIS AUTOMATIC CONTROL CIRCUIT

[75] Inventor: Bertrand Campagnie, Hondschoote, France

[73] Assignee: Thomson Composants Microondes, Puteaux, France

[21] Appl. No.: 446,600

[22] Filed: Dec. 6, 1989

[30] Foreign Application Priority Data

Dec. 9, 1988 [FR] France .................. 88 16217

[51] Int. Cl.⁵ .............................................. H03F 1/02
[52] U.S. Cl. ............................................ 330/9; 330/253
[58] Field of Search ............... 330/9, 51, 107, 252, 330/253, 254, 277

[56] References Cited

U.S. PATENT DOCUMENTS

| | | | |
|---|---|---|---|
| 4,577,162 | 3/1986 | Peterson | 330/253 |
| 4,628,274 | 12/1986 | Vittoz et al. | 330/9 |
| 4,707,624 | 11/1987 | Yee | 307/491 |
| 4,806,875 | 2/1989 | Schaffer | 330/9 |

FOREIGN PATENT DOCUMENTS 2624324 6/1989 France .

*Primary Examiner*—Steven Mottola
*Attorney, Agent, or Firm*—Oblon, Spivak, McClelland, Maier & Neustadt

[57] ABSTRACT

Disclosed is an automatic control circuit for a device comprising at least one transistor mounted as a current source. To achieve the automatic control of its mean off-load voltage at a given level, this circuit includes an automatic control of the voltage Vgs of said transistor by a follower-shifter circuit; wherein the control of the shift voltage of the follower circuit is accomplished by the charge from a capacitor, wherein the capacitor is charged, in a calibrating step, by shifter circuit looped to the capacitor, through a switch control by a clock.

7 Claims, 1 Drawing Sheet

CIRCUIT FOR THE AUTOMATIC CONTROL OF THE OFF-LOAD VOLTAGE OF A LOAD, AND DIFFERENTIAL COMPARATOR INCLUDING THIS AUTOMATIC CONTROL CIRCUIT

BACKGROUND OF THE INVENTION

1. Field of the Invention

The invention concerns a circuit for the automatic control of the off-load voltage of a device having a load formed by a current source. It can be applied, notably, to differential comparators in which two input signals are compared by two transistors, each loaded by a current source which is itself formed by a transistor, the gate and source of which are connected. The circuit according to the invention further provides, in this case, for the self-calibration, namely the compensation of offset between the two arms of the comparator.

2. Description of the Prior Art

It is known that a transistor having its source and its gate connected together (Vgs=0) forms a current source which delivers a constant current proportionate to the size of the transistor. However, owing to the very small sizes (in the range of micrometers) of present-day transistors, and especially in the microwave field, it is not always possible to obtain a plurality of transistors which are strictly identical to one another. As a consequence, two identically designed current sources may be made in a manner that is not strictly identical for reasons of technology.

Thus, if we consider a known simple differential comparator, such as the one shown in FIG. 1: it has two transistors T2 and T3, the gates of which form the inputs E1 and E2 of the comparator. These two transistors are powered by a current source T1 and loaded by two transistors, T4 and T5, which are mounted as current sources and have outputs S1 and S2 made on their gates. If, for technological reasons, the current set by the current source is not strictly equal to that set by the current sources T4 and T5, the result thereof is a major difference between the mean off-load levels at S1 and S2. The term "mean off-load levels" refers to the voltages obtained when the input signals at E1 and E2 are equal and in the middle of the dynamic range.

By way of example, a difference of 10% on the gate width of T4 or T5 takes the off-load level to saturation, which makes the use of this comparator very difficult. It is therefore necessary to stabilize this comparator, especially if it works in microwave mode, hence with sub-micronic gate widths.

Furthermore, if the current set by T4 is not strictly equal to that set by T5, the off-load levels of S1 and S2 are not the same a so-called offset voltage appears.

There is a known stabilization device such as the one shown in FIG. 2. A control loop is added to a comparator such as the one of FIG. 1. This control loop has as follower transistor T9, a plurality of diodes D1 . . . D3 . . . and a current source T11. The output signal S1 is applied to the gate of the transistor T9 and the voltage tapped between the diodes and the current source T11 is applied to the gate of the current source T1. This circuit controls the off-load level S2 by adjusting the current T1.

However, while a device such as this is satisfactory in certain cases, it has a few imperfections:

the amplitude of the output signals at S2 is twice as great as the amplitude at S1 for the circuit is not symmetrical;

the shifter circuit needed at the stabilization loop, namely the row of diodes, has very poor behavior under temperature;

this system achieves no self-calibration: the offset between S1 and S2 is not compensated for.

SUMMARY OF THE INVENTION

The circuit according to the invention makes it possible to resolve the two problems that have been explained: that of self-stabilization, if we consider a current source alone, and that of self-calibration or elimination of offset, if we consider a symmetrical system such as a comparator. Between the gate and the source of a load transistor mounted as a current source, this circuit introduces an adjustable voltage formed by a pseudo-generator. This pseudo-generator is formed by a capacitor charged during a calibration stage, controlled by a clock. The voltage at the terminals of the capacitor is variable, as a function of the output level when a reference voltage is injected into the input. This variable voltage makes it possible to adjust the Vgs of the transistor mounted as a current source.

If two circuits according to the invention are mounted symmetrically on the two load transistors of a differential comparator:

the fraction common to the two variable voltages of the two pseudo-generators stabilizes the mean off-load levels of the outputs S1 and S2 the difference between these two voltages compensates for the offset between the outputs S1 and S2.

More precisely, the invention concerns a circuit for the automatic control of the off-load voltage of a device comprising a load transistor mounted as a current source, comprising:

means for the automatic control of the gate/source voltage Vgs of said transistor, these means being formed by a follower-shifter circuit which acts as a voltage pseudo-generator, means to control the shift voltage of said follower-shifter circuit by the load stored in a capacitor;

means for charging said capacitor by a shifter circuit which, during a calibration stage, taps the output voltage from the device and reinjects it into the storage capacitor.

BRIEF DESCRIPTION OF THE DRAWINGS

The invention will be understood more clearly from the following detailed description made with reference to the appended figures, of which.

DESCRIPTION OF A PREFERRED EMBODIMENT

It has been stated that the invention concerns a circuit for the automatic control of the off-load voltage of a transistor mounted as a current source: however, the description of the invention will be clearer and its advantages will be better highlighted if we consider a symmetrical system such as a comparator, provided with two automatic control circuits according to the invention. This is not a restriction of the scope of the invention.

In the same way, the drawings shown field effect transistors, but the invention can equally well be applied to bipolar transistors. Whether they are made of silicon or of group III-IV materials such as GaAs, these transistors are, however, all normally on.

Figure 1:
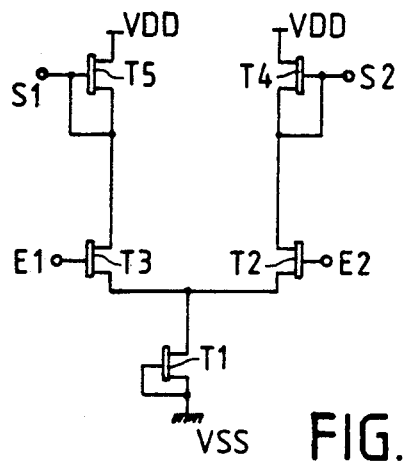
FIG. 1 shows an electrical diagram of a known differential comparator.
Figure 2:
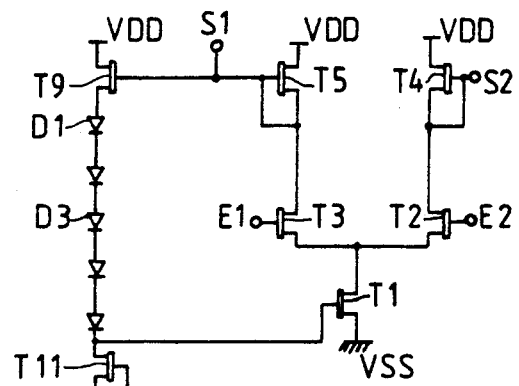
FIG. 2 shows an electrical diagram of a known circuit for the stabilization of a differential comparator, these two figures having been explained beforehand.
Figure 3:
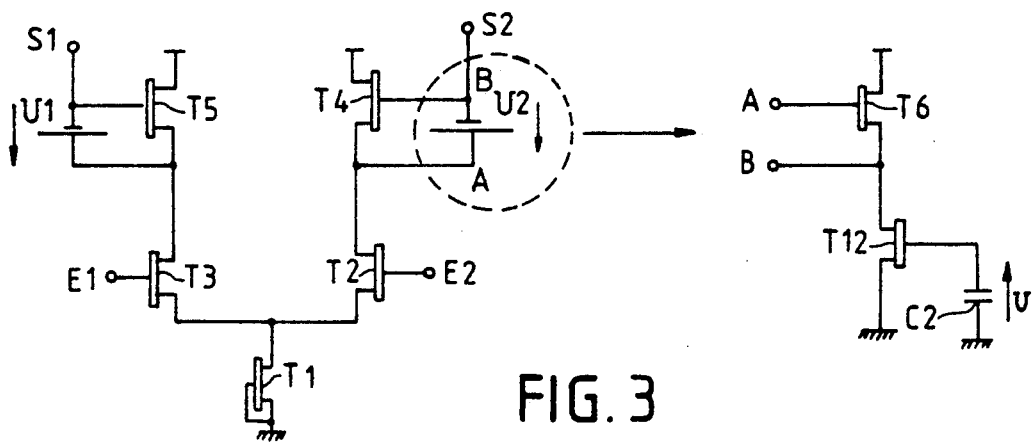
FIG. 3 shows an electrical equivalent circuit diagram of the circuit according to the invention.

The invention, in its basic features, is shown on the left-hand part of FIG. 3, while the right-hand part of this figure gives its embodiment. Let us consider a circuit such as the differential comparator of FIG. 1, wherein the direct gate-source links of the two load transistors T4 and T5 (Vgs=0V) are replaced by two pseudo-generators which give voltages U1 and U2.

The problems of the simple differential comparator would be resolved if the voltages of the pseudo-generators U1 and U2 could be adjusted to their exact value. In effect, by adjusting U1 and U2, we adjust the gate-source voltages Vgs4 and Vgs5 of T4 and T5. And, consequently, the currents in T4 and in T5 are thereby modified.

The voltage fraction common to U1 to U2 makes it possible to correct the mean off-load levels of the outputs S1 and S2, thus providing for the stabilization of the common mode, namely for the self-stabilization function.

The difference in voltage between U1 and U2 makes it possible to compensate for the offset and provides for the self-calibration function.

As is shown in the right-hand part of the figure, these pseudo-generators are each formed by a capacitor C2, one electrode of which is grounded and delivers power to a follower formed by two series-mounted transistors T6 and T12, as regards the voltage U2. This capacitor is charged during an operating stage called a calibration stage, which shall be explained further below: during said stage, the input signals E1 and E2 are cut off and replaced by a reference signal. The signal resulting at the output S2 is reinjected into the capacitor, the charge of which is therefore variable. The voltage between A and B, at the gate and at the source of the transistor T6, forms the voltage U2 (or, symmetrically, the voltage U1 for the other arm of the differential comparator).

This operation calls for a clock signal H and its complement $\overline{H}$ for the measuring and calibration stages.

In brief, the working of a circuit such as this relies on two distinct stages:
a calibration stage during which the capacitors get charged so as to obtain the right off-load voltages,
a measuring stage during which the comparator fulfils its conventional function, but with correction voltages stored in the capacitors.

Figure 4:
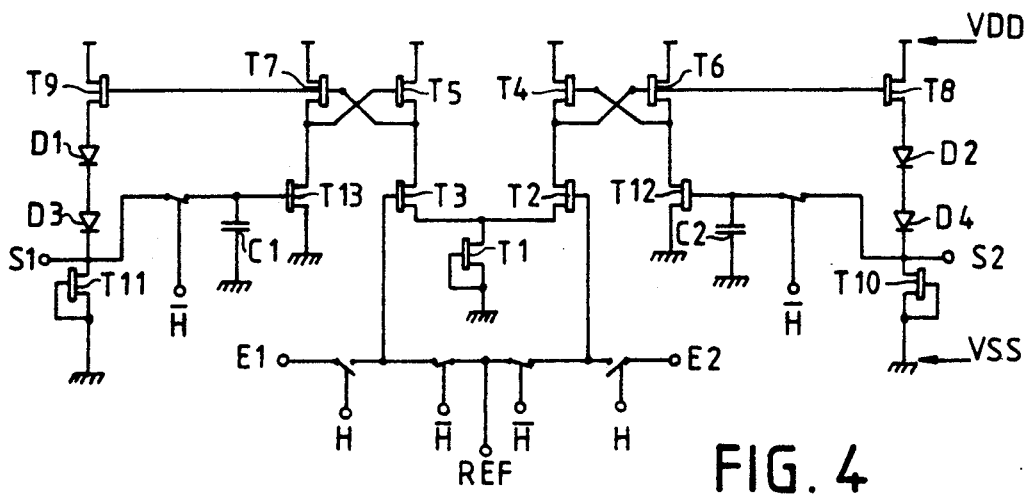
FIG. 4 shows a diagram of application, of the circuit according to the invention, to a differential comparator.

The practical embodiment of this automatic control circuit is given in FIG. 4, where two circuits according to the invention are added to the two arms of a differential comparator, which makes it a comparator that is self-stabilized (having the mean off-load levels of its outputs S1 and S2 at well determined levels) and self-calibrated (having the same mean off-load levels).

The following can be distinguished in this diagram:
the differential comparator T1 to T5,
the two followers T6+T12 and T7+T13,
the two shifter circuits T8+D2+D4+T10 and T9+D1+D3+T11,
the two storage capacitors C2 and C1,
the circuit of inputs by which the signals E1, E2 and REF are applied to the gates of the transistors T2 and T3 of the comparator.

The input circuit includes, for each channel, two switches, one of which is controlled by the clock signal H and the other by the complement $\overline{H}$, to inject the reference signal during the calibration stage or the input signal E1/E2 during the measuring stage.

For each channel, the gate of the load transistor T4 (T5) is connected to the common point of the two transistors T6+T12 (T7+T13) of the follower, and the source of the same load transistor T4 (T5) is connected to the gates of the load transistors T6 (T7) of the follower and T8 (T9) of the shifter circuit.

The voltage present at the point common to the supply transistor T10 (T11) and the last diode D4 (D3) of the shifter circuit is tapped firstly as an output voltage S2 (S1) and, secondly, as a load voltage of the storage capacitor C2 (C1) through a switch controlled by the clock signal complement $\overline{H}$.

In a calibration stage, the switches controlled by the clock signal complement $\overline{H}$ are closed, and the switches controlled by the clock signal H are open. In a measuring stage, the reverse occurs.

Let us consider the follower-shifter circuit T6+T12+C2. The two normally-on transistors of this circuit are of identical size and are series mounted. They get biased at identical voltages Vgs. The voltage between the points A and B (FIG. 3) is therefore equal to the voltage U at the terminals of the capacitor C2.

In a calibration stage, the input signals E1 and E2 are isolated by the two switches controlled by the clock signal H. Each arm of the comparator has its input connected to the reference voltage REF, for which it is desired that the comparator should flip over, and the output signal (shifted by about two volts if there are two diodes for each shifter) is recovered at the point S1/S2, and this provides for the charging of the capacitor C1/C2.

In fact, since the circuit is looped to itself with a loop gain G, the voltage at the terminals of C1/C2 gets stabilized, and the difference in residual voltage between the output and the ground is equal to the initial difference, i.e. the difference that would exist if there were no stabilization circuit, divided by this gain G. Thus, we achieve the self-stabilizing function of the off-load levels of each arm.

In a measuring stage, the switches controlled by the clock signal H inject the input signals E1/E2 while the switches controlled by the complement $\overline{H}$ isolate the storage capacitors C1/C2. These capacitors impose their voltage U on the gate of the current source transistors T12/T13 for the follower-shifter circuits.

Just as for the mean off-load levels, the residual offset between the two outputs S1 and S2 is equal to the initial offset divided by the same gain G. Thus, the function of self-calibration of the differential comparator is achieved.

In brief, for a circuit with at least one load transistor T4 or T5, the circuit according to the invention achieves:
the automatic control of the voltage Vgs of the load transistor T4 by a follower-shifter circuit: transistor T6+T12 and capacitor C2
the control of the shift voltage of this follower-shifter by the load of a capacitor C2, the charging of this capacitor during a calibration stage, the circuit being then looped on itself during this stage.

The circuit according to the invention is applied to devices in which a load transistor works as a current source, but it is particularly valuable in the case of differential amplifiers or comparators.

What is claimed is:

1. A circuit for the automatic control of the off-load voltage of a device comprising a load transistor mounted as a current source, comprising:
   means for the automatic control of the gate/source voltage Vgs of said transistor, said means being formed by a follower-shifter circuit which, provides a voltage pseudo-generator,
   means to control the shift voltage of said follower-shifter circuit by the charge stored in a capacitor;
   means for loading said capacitor by a shifter circuit which, during a calibration step, taps the output voltage from the device and reinjects it into the storage capacitor.

2. A circuit according to claim 1, wherein said follower-shifter circuit is formed by two series-connected transistors, the gate and the source of a first transistor of said two transistors being connected respectively to the source and to the gate of the load transistor; said circuit further including a storage capacitor, one terminal of which is connected to the gate of the second transistor of the follower-shifter circuit, and the other terminal of which is connected to the ground of the circuit; and wherein said means to control the shift voltage includes a shifter circuit formed by a third transistor, series-connected with a plurality of diodes and with a fourth transistor mounted as a current source, the gate of the third transistor being connected to the gate or to the source of the load transistor, and the output signal at the drain of the fourth transistor being looped to the storage capacitor through a switch controlled by the clock signal.

3. A control circuit according to claim 2, wherein the transistors are of the normally-on type.

4. An automatic control circuit according to claim 2 wherein, G being the gain of the automatic control loop, the variation in the off-load voltage of the output is equal to the variation in the initial off-load voltage, without automatic control voltage, divided by the gain G of the loop.

5. A differential comparator, comprising a current source transistor and two arms, each formed by an input transistor and a load transistor, wherein the off-load voltages of the two load transistors of said differential comparator are each automatically controlled by an automatic control circuit according to claim 2, and wherein said comparator further comprises, input channels and switches at said channels wherein said switches are controlled by a clock signal to inject input signals into gates of the input transistors and switches controlled by a clock complement signal to inject a reference signal instead of the input signals.

6. A differential comparator according to claim 5, wherein:
   during a calibration step controlled by the clock complement signal, the reference signal is injected into the gates of the input transistors and output signals are looped to the storage capacitors of the two automatic control circuits;
   during a measuring stage, controlled by the clock signal, the reference signal is isolated, the loops between the outputs and the storage capacitors are open and the voltages at the terminals of capacitors are applied to the load transistors of the two arms of the comparator.

7. A differential comparator according to claim 5 wherein, G being the gain of the two automatic control loops, the offset voltage between the two outputs is equal to the initial offset voltage, without the automatic control circuits, divided by the gain G of the loops.

* * * * *